United States Patent [19]
Sovero

[11] Patent Number: 5,317,173
[45] Date of Patent: May 31, 1994

[54] HBT DIFFERENTIAL PAIR CHIP FOR QUASI-OPTIC AMPLIFIERS

[75] Inventor: Emilio A. Sovero, Thousand Oaks, Calif.

[73] Assignee: Rockwell International Corporation, Seal Beach, Calif.

[21] Appl. No.: 62,361

[22] Filed: May 13, 1993

[51] Int. Cl.[5] .................... H01L 29/72; H01L 29/161
[52] U.S. Cl. .................... 257/197; 257/539; 257/566; 257/577; 257/584
[58] Field of Search .............. 257/197, 539, 566, 577, 257/584, 622, 774

Primary Examiner—Mark V. Prenty
Attorney, Agent, or Firm—John C. McFarren

[57] ABSTRACT

A monolithic integrated circuit provides RF and DC coupling for a unit cell of a high power quasi-optic grid amplifier. The monolithic chip includes two heterojunction bipolar transistors (HBTs) connected in a differential pair configuration with a common emitter and integrated collector-base and emitter bias resistors. Each of the plurality of unit cells comprising the quasi-optic grid amplifier includes an emitter-coupled HBT differential pair chip at the center, an input antenna that extends horizontally in both directions from the two base leads, an output antenna that extends vertically in both directions from the two collector leads, and high inductance bias lines for the emitter and collectors. The grid amplifier, which functions as a high frequency, high gain, wide bandwidth, free-space beam amplifier, comprises a plurality of unit cells arranged in a repeating pattern of input and output dipole antennas. For high frequency applications, the plurality of unit cells may be integrated on one surface of the monolithic chip.

13 Claims, 2 Drawing Sheets

HBT DIFFERENTIAL PAIR CHIP FOR QUASI-OPTIC AMPLIFIERS

TECHNICAL FIELD

The present invention relates to grid amplifiers and, in particular, to a self-biased heterojunction bipolar transistor differential pair chip for quasi-optic amplifiers.

BACKGROUND OF THE INVENTION

Solid-state devices quasi-optically coupled in free space provide efficient schemes for combining power at microwave and millimeter-wave frequencies by eliminating losses associated with waveguide walls and feed networks. A typical quasi-optical oscillator or amplifier comprises a two-dimensional array of active devices forming a planar sheet with a reflection or transmission coefficient greater than unity. A resonator can be used to provide feedback to couple the devices together to form a high-power oscillator, or the active sheet can be placed between polarizers to form a grid amplifier. By integrating large numbers of devices into a grid, very large power can be achieved.

Grid amplifiers require the interaction of free space RF signal beams with an array of input antennas. After amplification, the signal is transmitted by a set of output antennas. Devices of this kind have been fabricated as hybrid structures for operation at low frequencies on the order of 10 GHz. However, the use of discrete components to build grid amplifier unit cells requires many connections that result in an amplifier that is very complex. Because of the limitations of prior art grid amplifiers, there is a need for a monolithic implementation of quasi-optical components that provides a grid amplifier that can be easily scaled to microwave and millimeter-wave frequencies, and is smaller, lighter, and substantially less costly than conventional phased-array systems.

SUMMARY OF THE INVENTION

The present invention comprises a monolithic integrated circuit that incorporates the RF and DC coupling requirements of a unit cell of a quasi-optic grid amplifier. The monolithic chip includes heterojunction bipolar transistors (HBTs) connected in a differential pair configuration with integrated collector-base and emitter bias resistors. Each unit cell of the planar grid amplifier includes an emitter-coupled HBT differential pair chip at the center, an input antenna that extends horizontally in both directions from the two base leads, an output antenna that extends vertically in both directions from the two collector leads, and high inductance bias lines for the emitter and collectors. The grid amplifier, which functions as a free-space beam amplifier, comprises a plurality of unit cells arranged in a repeating pattern of input and output dipole antennas.

A principal object of the invention is a high power quasi-optic grid amplifier. A feature of the invention is an HBT differential pair chip for each unit cell of the grid amplifier. Advantages of the invention include higher operating frequency, larger gain, and wider bandwidth in a planar quasi-optic grid amplifier.

BRIEF DESCRIPTION OF THE DRAWINGS

For a more complete understanding of the present invention and for further advantages thereof, the following Detailed Description of the Preferred Embodiment makes reference to the accompanying Drawings, in which.

DETAILED DESCRIPTION OF THE PREFERRED EMBODIMENT

Figure 1:
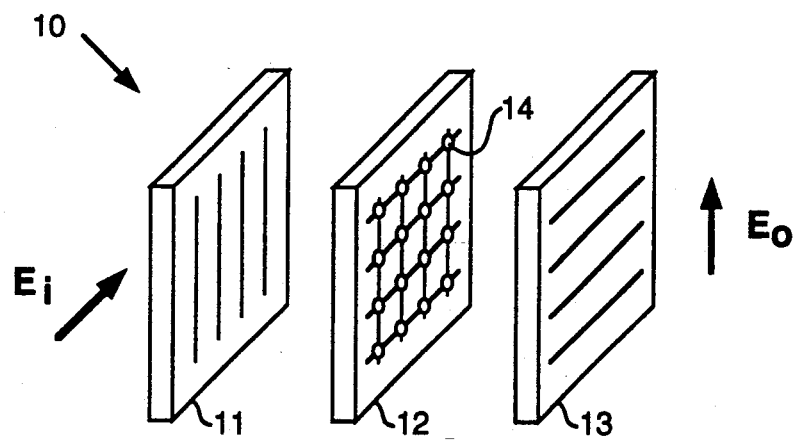
FIG. 1 is a perspective view of a quasi-optic grid amplifier having input and output polarizers.

The present invention comprises a monolithic integrated circuit that provides RF and DC coupling for a unit cell of a quasi-optic grid amplifier. A typical quasi-optic amplifier, as illustrated in FIG. 1, comprises a two-dimensional array of active devices with a transmission coefficient greater than unity. Quasi-optic amplifier 10 includes a sheet 12 of active devices placed between polarizers 11 and 13. Sheet 12 comprises an array or grid of unit cells 14 designed to receive an incident beam $E_i$ from one side and radiate an amplified beam $E_o$ to the opposite side. Thus, quasi-optic grid amplifier 10, which comprises a plurality of unit cells 14 arranged in a repeating pattern of input and output dipole antennas, functions essentially as a free-space beam amplifier. In operation, horizontally polarized input wave $E_i$ passes through input polarizer 11 and couples to the input leads of the unit cells 14 of the grid. An amplified current then flows on the vertical leads of the grid, which radiate vertically polarized and amplified output signal $E_o$ through output polarizer 13. Polarizers 11 and 13 provide input-output isolation (to minimize coupling and diminish the chance of unwanted oscillations) as well as impedance matching for the input and output ports. By integrating a large number of unit cells 14 into grid amplifier 10, large power output can be obtained at microwave and millimeter-wave frequencies.

Figure 2:
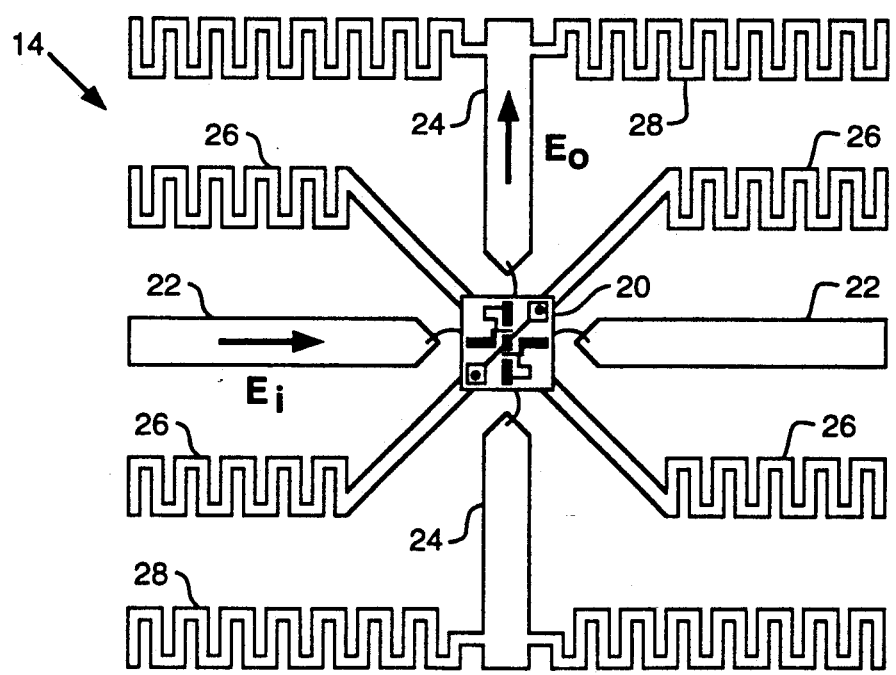
FIG. 2 is a plan view of a unit cell of the quasi-optic grid amplifier of FIG. 1 that includes an HBT differential pair chip of the present invention.

A unit cell 14 of quasi-optic grid amplifier 10 is illustrated in plan view in FIG. 2. Each unit cell 14 of planar grid amplifier 10 includes an emitter-coupler HBT differential pair chip 20 of the present invention at the center, an input antenna 22 that extends horizontally in both directions on sheet 12 from the two base leads of chip 20, an output antenna 24 that extends vertically in both directions on sheet 12 from the two collector leads of chip 20, high inductance bias lines 26 for the common emitter of chip 20, and high inductance bias lines 28 for the collectors of chip 20. Thin bias lines 26 and 28 present a large inductive reactance to input wave $E_i$ and have minimal effect on the input coupling between input wave $E_i$ and input antenna 22. Contacts for the common emitter of chip 20 may include metallization on the back side for ease in mounting chip 20 in contact with high inductance emitter bias lines 26 on sheet 12, as described below in conjunction with FIGS. 3 and 4. As shown in FIG. 2, input wave $E_i$ is received on input antenna 22 and amplified output signal $E_o$ is radiated on output antenna 24.

Figure 3:
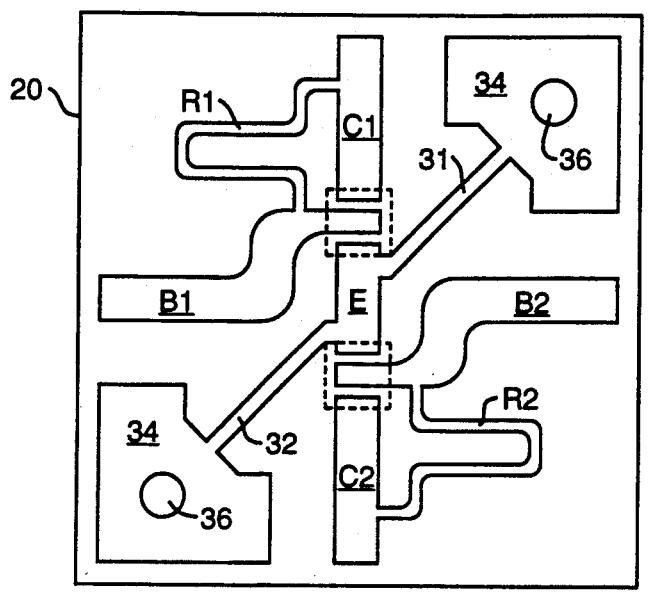
FIG. 3 is a plan view of the HBT differential pair chip included in the unit cell of FIG. 2.

Monolithic integrated circuit chip 20 of the present invention is illustrated in greater detail in the plan view of FIG. 3. Chip 20 includes two heterojunction bipolar transistors (HBTs) connected in a differential pair configuration with integrated collector-base and emitter bias resistors. A first HBT comprises emitter E, base B1, collector C1, and bias resistor R1 connected between base B1 and collector C1. A second HBT comprises emitter E, base B2, collector C2, and bias resistor R2 connected between base B2 and collector C2. The active areas of the HBTs of chip 20 are within the dotted line regions of FIG. 3. An emitter bias resistor (which also serves to suppress common mode gain) is implemented as a parallel combination of resistors 31 and 32 for symmetry reasons. As stated above, emitter contact pads 34 may include optional vias 36 that contact metallization on the back side of chip 20 for ease in connecting chip 20 to emitter bias leads 26 on sheet 12.

Figure 4:
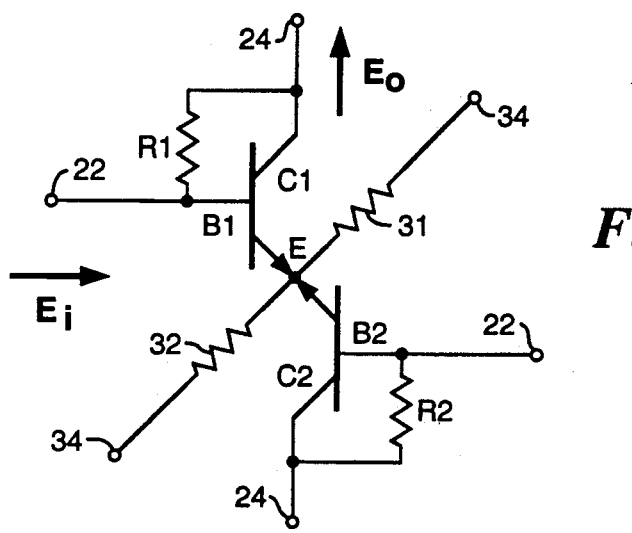
FIG. 4 is a schematic circuit diagram of the HBT differential pair chip of FIG. 3.

FIG. 4 illustrates a schematic circuit diagram of chip 20, with the same reference numerals indicating the same elements as shown in FIGS. 2 and 3. As shown in both FIGS. 2 and 4, input wave $E_i$ is received on input antenna 22 and amplified output signal $E_o$ is radiated on output antenna 24.

One embodiment of chip 20, presented as an example and not a limitation, was fabricated of AlGaAs/GaAs HBT material grown by MBE as specified in Table 1 below.

TABLE 1

| LAYER | THICKNESS (μm) | TYPE | DOPING (cm$^{-3}$) |
|---|---|---|---|
| Cap | 0.16 | n+ | $5 \times 10^{18}$ |
| Emitter | 0.1 | n | $0.5 - 1.5 \times 10^{18}$ |
| Base | 0.07 | p+ | $0.5 - 1.0 \times 10^{20}$ |
| Collector | 0.7 | n | $3 - 6 \times 10^{16}$ |
| Subcollector | 0.6 | n+ | $6 \times 10^{18}$ |

TABLE 1

Chip 20, as specified above, was implant isolated with an active emitter area of 40 square microns. Overall, chip 20 measured 400 μm on a side. The HBT transistors exhibited $f_T = 65$ GHz and $f_{max} = 90$ GHz. Each chip 20 contained an HBT differential pair with 1.7 kΩ collector-base bias resistors and a 250Ω emitter bias resistor (comprising a parallel combination of two 500Ω resistors, as explained above). A 16-element amplifier grid (4×4 array) with polarizers was fabricated on a 3.175 mm thick RT Duroid ™ board having a dielectric constant of 2.2. Unit cell size was 8 mm, and the width of the coupling leads was 0.8 mm. The whole grid was biased at 5 V and 135 mA including the voltage across the resistors. The amplifier exhibited a peak gain of 12 dB at 9.9 GHz, with a 3 dB bandwidth that extended from 9.55 GHz to 10.3 GHz. The peak gain and bandwidth were sensitive to polarizer position, indicating that the polarizers provided good matching to free space (as a reference point, the transistors had 18 dB unilateral gain at 10 GHz). Output power was linear with input power, indicating that the grid operated as an amplifier rather than as an injection-locked oscillator. Gain saturation was observed at low DC bias and high input RF levels.

Quasi-optic amplifier 10 incorporating HBT differential pair chip 20 provides higher operating frequency, larger gain, and wider bandwidth compared with previous grid amplifiers using packaged discrete MESFETs. In the design of amplifier 10, the contents of each unit cell 14 are monolithically integrated with the exception of the metal lines that make up the antenna array. Furthermore, amplifier 10 is self-biased so that only one power supply is required for the collector, thus simplifying the DC power distribution.

Figure 5:
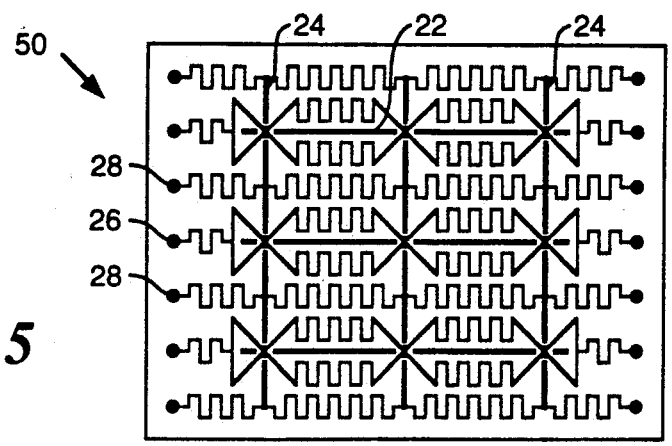
FIG. 5 is a schematic plan view of a monolithic chip comprising a quasi-optic grid amplifier.

FIG. 5 illustrates an extension of the present invention in the form of a monolithic integrated circuit chip 50 comprising a 3×3 quasi-optic amplifier grid fully integrated on the top surface of monolithic chip 50. Chip 50 is presented merely as an example (and not a limitation) of one possible layout for a monolithic quasi-optic amplifier grid having elements similar to those shown in FIG. 2. A typical amplifier grid might comprise a 10×10 array of unit cells, each including an HBT differential pair. The HBTs, antennas, and bias lines of chip 50 can be fabricated on a semiconductor substrate using well known photolithographic masking, etching, and deposition techniques. The scale of the receiving and radiating antennas 22 and 24 of chip 50 is determined by the RF frequencies of interest (i.e., the higher the frequency, the smaller the scale). A 10×10 array of unit cells operating at 44 GHz, for example, might be integrated on a monolithic chip measuring approximately 10 mm×10 mm.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

I claim:

1. A monolithic heterojunction bipolar transistor (HBT) differential pair chip, comprising: first and second HBTs fabricated on said chip, said HBTs having a common emitter;

said first HBT further comprising a first collector, a first base, and a first bias resistor connecting said first collector and said first base;

said second HBT further comprising a second collector, a second base, and a second bias resistor connecting said second collector and said second base; and an emitter bias resistor connected to said common emitter.

2. The monolithic chip of claim 1, wherein said emitter bias resistor comprises a pair of parallel connected bias resistors.

3. The monolithic chip of claim 1, further comprising means for connecting said chip to form a unit cell of a quasi-optic amplifier.

4. The monolithic chip of claim 3, wherein said unit cell comprises an input antenna connected to said first and second bases, an output antenna and a high inductance collector bias line connected to said first and second collectors, and a high inductance emitter bias line connected to said emitter bias resistor.

5. The monolithic chip of claim 4, wherein said connecting means further comprises a via connecting said emitter bias resistor to said high inductance emitter bias line at the back side of said chip.

6. A monolithic heterojunction bipolar transistor (HBT) differential pair chip for a unit cell of a quasi-optic amplifier, comprising:

first and second HBTs fabricated on said chip, said HBTs having a common emitter, said first HBT further comprising a first collector, a first base, and a first bias resistor connecting said first collector and said first base;

said second HBT further comprising a second collector, a second base, and a second bias resistor connecting said second collector and said second base;
an emitter bias resistor connected to said common emitter;
said first and second bases connected to an input antenna of said amplifier;
said first and second collectors connected to an output antenna of said amplifier;
a high inductance collector bias line connected to said collectors; and
a high inductance emitter bias line connected to said emitter bias resistor.

7. The monolithic HBT chip of claim 6, wherein said emitter bias resistor comprises a pair of parallel connected bias resistors.

8. The monolithic HBT chip of claim 6, further comprising a via connecting said emitter bias resistor to said high inductance emitter bias line at the back side of said chip.

9. The monolithic HBT chip of claim 6, wherein said chip includes said HBT differential pair, said input and output antennas, said collector bias line, and said emitter bias line integrated on one surface of said monolithic chip.

10. A quasi-optic grid amplifier having a plurality of unit cells, each of said unit cells comprising:
first and second heterojunction bipolar transistors (HBTs) fabricated on a monolithic chip, said HBTs connected in a differential pair configuration with a common emitter;
said first HBT further comprising a first collector, a first base, and a first bias resistor connecting said first collector and said first base;
said second HBT further comprising a second collector, a second base, and a second bias resistor connecting said second collector and said second base;
an emitter bias resistor connected to said common emitter;
said first and second bases connected to an input antenna of said grid amplifier;
said first and second collectors connected to an output antenna of said grid amplifier;
a high inductance collector bias line connected to said collectors; and
a high inductance emitter bias line connected to said emitter bias resistor.

11. The quasi-optic grid amplifier of claim 10, wherein said emitter bias resistor comprises a pair of parallel connected bias resistors.

12. The quasi-optic grid amplifier of claim 10, further comprising a via connecting said emitter bias resistor to said high inductance emitter bias line at the back side of said chip.

13. The quasi-optic grid amplifier of claim 10, wherein said plurality of unit cells are integrated on one surface of said monolithic chip.

* * * * *